United States Patent
Bogner et al.

(10) Patent No.: US 9,136,857 B2
(45) Date of Patent: Sep. 15, 2015

(54) ADC WITH SAMPLE AND HOLD

(75) Inventors: Peter Bogner, Wernberg (AT); Franz Kuttner, St. Ulrich (AT)

(73) Assignee: IFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 13/539,658

(22) Filed: Jul. 2, 2012

(65) Prior Publication Data

US 2014/0002286 A1    Jan. 2, 2014

(51) Int. Cl.
 *H03M 1/00*  (2006.01)
 *H03M 1/12*  (2006.01)

(52) U.S. Cl.
 CPC .................................. *H03M 1/1225* (2013.01)

(58) Field of Classification Search
 CPC ....................................................... H03M 1/125
 USPC ........................... 341/122, 155, 144, 163, 141
 See application file for complete search history.

(56) References Cited

U.S. PATENT DOCUMENTS

| | | | | | |
|---|---|---|---|---|---|
| 4,751,673 | A | * | 6/1988 | Agarwal et al. | 340/146.2 |
| 5,016,018 | A | * | 5/1991 | Chang et al. | 342/351 |
| 5,311,117 | A | * | 5/1994 | Komatsu et al. | 324/142 |
| 5,581,254 | A | * | 12/1996 | Rundel | 341/155 |
| 7,038,720 | B2 | * | 5/2006 | Rogers et al. | 348/241 |
| 7,123,894 | B2 | * | 10/2006 | Hessel et al. | 455/303 |
| 7,135,998 | B2 | * | 11/2006 | Fey et al. | 341/118 |
| 7,321,399 | B2 | * | 1/2008 | Rumreich | 348/572 |
| 7,411,533 | B2 | * | 8/2008 | Posamentier | 341/122 |
| 7,460,615 | B2 | * | 12/2008 | Kunysz et al. | 375/316 |
| 7,705,756 | B2 | * | 4/2010 | Harper | 341/141 |
| 7,796,069 | B2 | * | 9/2010 | Li | 341/122 |
| 8,004,435 | B2 | * | 8/2011 | Waki et al. | 341/122 |
| 2006/0094385 | A1 | * | 5/2006 | Rafati | 455/272 |
| 2008/0285694 | A1 | * | 11/2008 | Lee | 375/355 |
| 2010/0245143 | A1 | * | 9/2010 | Stanley et al. | 341/141 |

* cited by examiner

*Primary Examiner* — Peguy Jean Pierre
(74) *Attorney, Agent, or Firm* — SpryIP, LLC

(57) ABSTRACT

Representative implementations of devices and techniques provide analog to digital conversion of multiple parallel analog inputs. An input interface is arranged to organize the parallel analog inputs and an analog-to-digital converter (ADC) is arranged to sequentially convert the multiple parallel analog inputs to digital results.

13 Claims, 4 Drawing Sheets

ADC WITH SAMPLE AND HOLD

BACKGROUND

In some high-end microcontroller applications, (e.g., industrial, automotive, aeronautical, etc.) many analog signals may be converted to digital form and processed concurrently. For example, in such applications, multiple sensors may provide information about various aspects of complex systems, with the sensors providing analog signals at their output. With evolution in various technologies, an increasing number of analog channels are desired to be converted to a digital form concurrently for processing. In some cases, multiple analog channels may each carry multiple analog signals from multiple sources, for example.

Typically, an increase in the quantity of analog signals to be processed results in the deployment of an increased number of analog-to-digital converters (ADCs) in an application. However, this increase in the number of ADCs increases the amount of area consumed to provide the ADCs for the application, as well as the amount of energy consumed to power them.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide analog to digital conversion of multiple parallel analog inputs. An input interface is arranged to serially organize the multiple parallel analog inputs and an analog-to-digital converter (ADC) is arranged to sequentially convert the multiple parallel analog inputs to digital results. In one implementation, a single ADC is used to convert analog signals from multiple channels to digital form.

In one implementation, the interface is composed of passive components. For example, no active components (e.g., amplifiers, etc.) are used in the implementation of the interface. In another implementation, a demultiplexer component is arranged to direct outputs of the ADC to one or more parallel output channels.

Various implementations and techniques for an analog to digital conversion arrangement are discussed in this disclosure. Techniques and devices are discussed with reference to example analog-to-digital converter (ADC) devices and systems illustrated in the figures. In some cases, successive-approximation ADC (SA-ADC) designs are shown and discussed. However, this is not intended to be limiting, and is for ease of discussion and illustrative convenience. The techniques and devices discussed may be applied to any of various ADC device designs, structures, and the like (e.g., direct-conversion ADC, flash ADC, ramp-compare ADC, integrating ADC (also referred to as dual-slope or multi-slope ADC), counter-ramp ADC, pipeline ADC, sigma-delta ADC, time interleaved ADC, intermediate FM stage ADC, etc.), and remain within the scope of the disclosure.

Implementations are explained in more detail below using a plurality of examples. Although various implementations and examples are discussed here and below, further implementations and examples may be possible by combining the features and elements of individual implementations and examples.

Example Parallel ADC Arrangement

Figure 1:
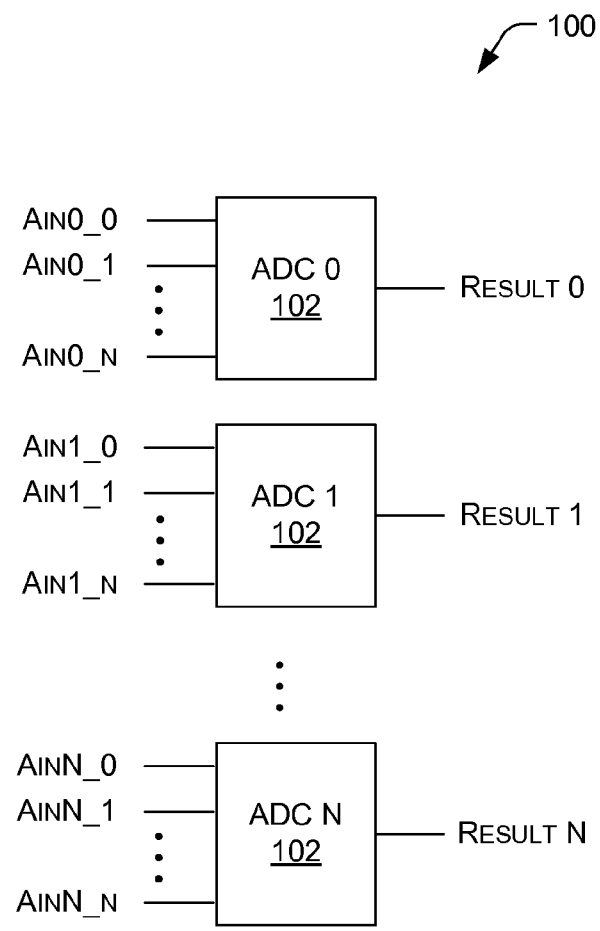
FIG. 1 is a block diagram of an example parallel analog-to-digital conversion arrangement, according to an implementation.

FIG. 1 is a block diagram of an example parallel analog-to-digital conversion (ADC) arrangement 100, wherein the techniques and devices described herein may be applied. Analog signals (Ain0_0 through AinN_N) are received on the input side, converted by a quantity of ADCs 102, and digital results (Result 0, Result 1, and Result N) are output from the ADCs 102. In various implementations, any number of analog inputs (Ain0_0 through AinN_N) may be received by any number of ADCs 102. Further, one or more digital results (Results 0-N) may be output by one or more of the ADCs 102. In various implementations, a number of ADCs 102 (ADC 0-N), or a number of digital results (Results 0-N) may be determined by a number of inputs available to a device or system (e.g., controller, processor, etc.) receiving the converted digital results (Results 0-N).

For the purposes of this disclosure, a digital result may be described as a digital approximation of an analog input. For example, a digital result may include a digital representation that is proportional to the magnitude of the voltage or current of the analog input, at a point in time and/or over a selected duration. The digital representation may be expressed in various ways (e.g., base 2 binary code, binary coded decimal, voltage values, electrical or light pulse attributes, and the like).

As shown in FIG. 1, an example parallel ADC arrangement 100 may include a quantity of ADCs 102 arranged in parallel. In an implementation, each ADC may represent a channel, with some of the analog inputs (e.g., Ain0_0 through Ain0_N) associated with the channel, one or more of the ADCs 102 (e.g., ADC 0) associated with the channel, and one or more corresponding outputs (e.g., Result 0) also associated with the channel. In alternate implementations, a parallel ADC arrangement 100 may include fewer, additional, or alternate components.

Example Serial ADC Arrangement

Figure 2:
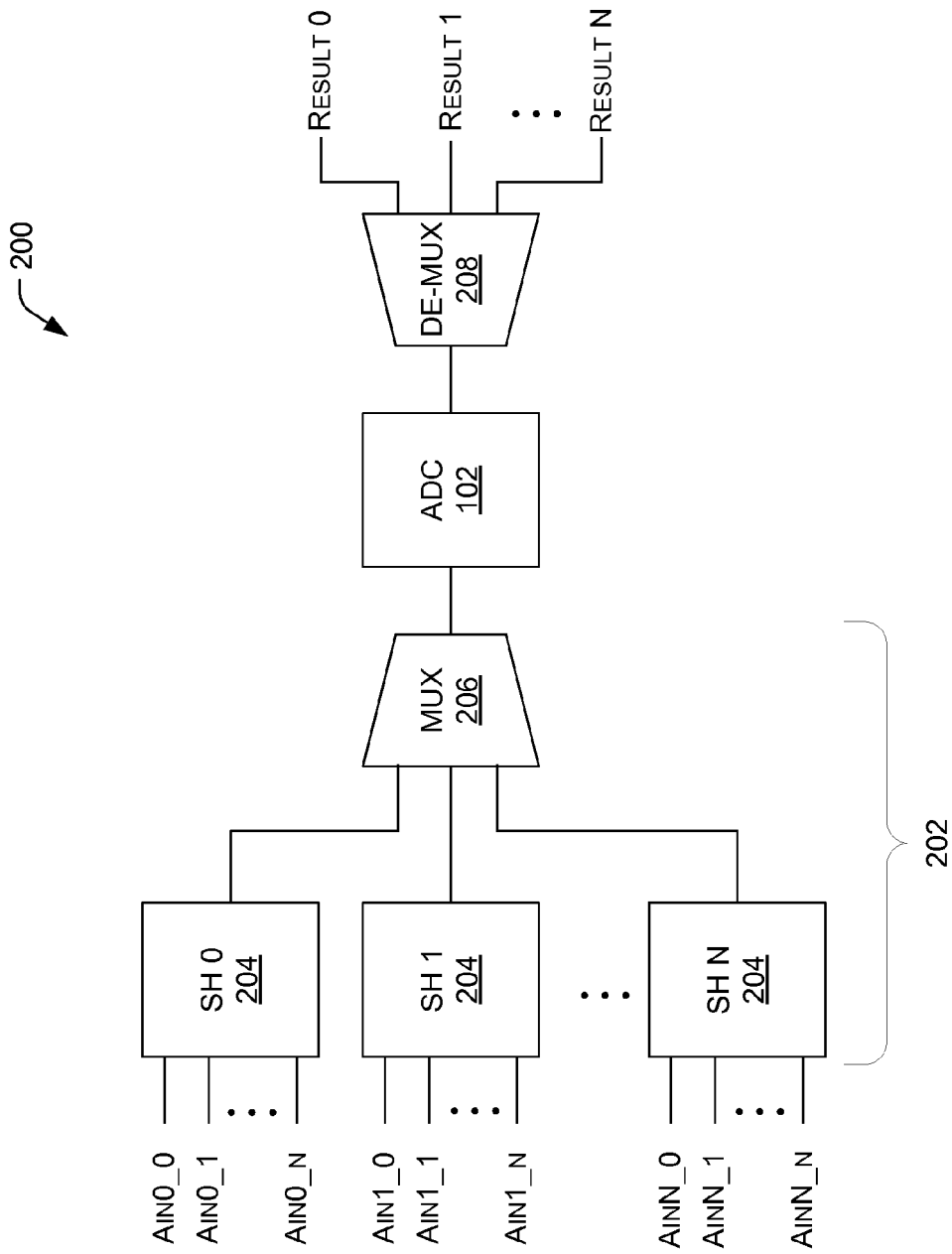
FIG. 2 is a block diagram of an example serial analog-to-digital conversion arrangement, including an input interface and an output demultiplexer, according to an implementation.

FIG. 2 is a block diagram of an example serial analog-to-digital conversion (ADC) arrangement 200. In an implementation, an interface 202 and a single ADC 102 may be substituted for some or all of the quantity of parallel ADCs 102 in a parallel ADC arrangement 100. For example, in an application where one or more analog channels with multiple concurrent analog input signals are to be converted to digital results, a single ADC 102 may be employed to convert the multiple input signals, with an interface 202 arranged to serially organize the multiple parallel analog inputs. In various other implementations, combinations of one or more serial ADC arrangements 200 with one or more parallel ADC arrangements 100 may be used. Employing a serial ADC arrangement 200 in place of a parallel ADC arrangement 100 has advantages of space (i.e., circuit area) savings and power savings, among others.

In an implementation, as shown in FIG. 2, an example serial ADC arrangement 200 includes a quantity of sample and hold (SH) circuits 204, a multiplexer circuit (MUX) 206, and an ADC 102. For example, the SH circuits 204 are arranged to receive analog input signals and sample the signals, outputting the sample value. The MUX circuit 206 is arranged to receive the outputs from the SH circuits 204, and multiplex them into a serial form, or a single channel. The ADC 102 receives the sample values serially from the MUX circuit 206, and converts the sample values in a sequential order into digital results. In an implementation, the digital results remain in a serial form as output from the ADC 102.

In a further implementation, the serial ADC arrangement 200 also includes a demultiplexer (DE-MUX) 208. If included, the DE-MUX 208 de-multiplexes the serial output from the ADC 102, and restores the digital outputs to multiple channels. For example, a digital output that is a result of an analog input from one of the SH circuits 204 is directed to an output channel associated with that SH circuit 204, and so on for each of the digital results. Accordingly, in a serial ADC arrangement 200 having a plurality of channels, each channel may include at least one SH circuit 204 and at least one associated output (e.g., result).

As discussed above, the techniques, components, and devices described herein with respect to the serial ADC arrangement 200 are not limited to the illustration in FIG. 2, and may be applied to other ADC devices and designs without departing from the scope of the disclosure. In some cases, additional or alternative components may be used to implement the techniques described herein. Further, the components may be arranged and/or combined in various combinations, while resulting in digital results (Results 0-N). It is to be understood that a serial ADC arrangement 200 may be implemented as a stand-alone device or as part of another system (e.g., integrated with other components, systems, etc.).

Referring to FIG. 2, each of the multiple SH circuits 204 is arranged to receive one or more analog signals (Ain0_0 through AinN_N). In one implementation, one or more of the SH circuits 204 is arranged to receive multiple concurrent analog input signals (Ain0_0 through AinN_N).

In an implementation, the SH circuits 204 are arranged to output a sample value based on at least one of the multiple analog signals (Ain0_0 through AinN_N) received. For example, the SH circuits 204 may sample an input analog signal (Ain0_0 through AinN_N) and output the value of the sample.

Figure 3:
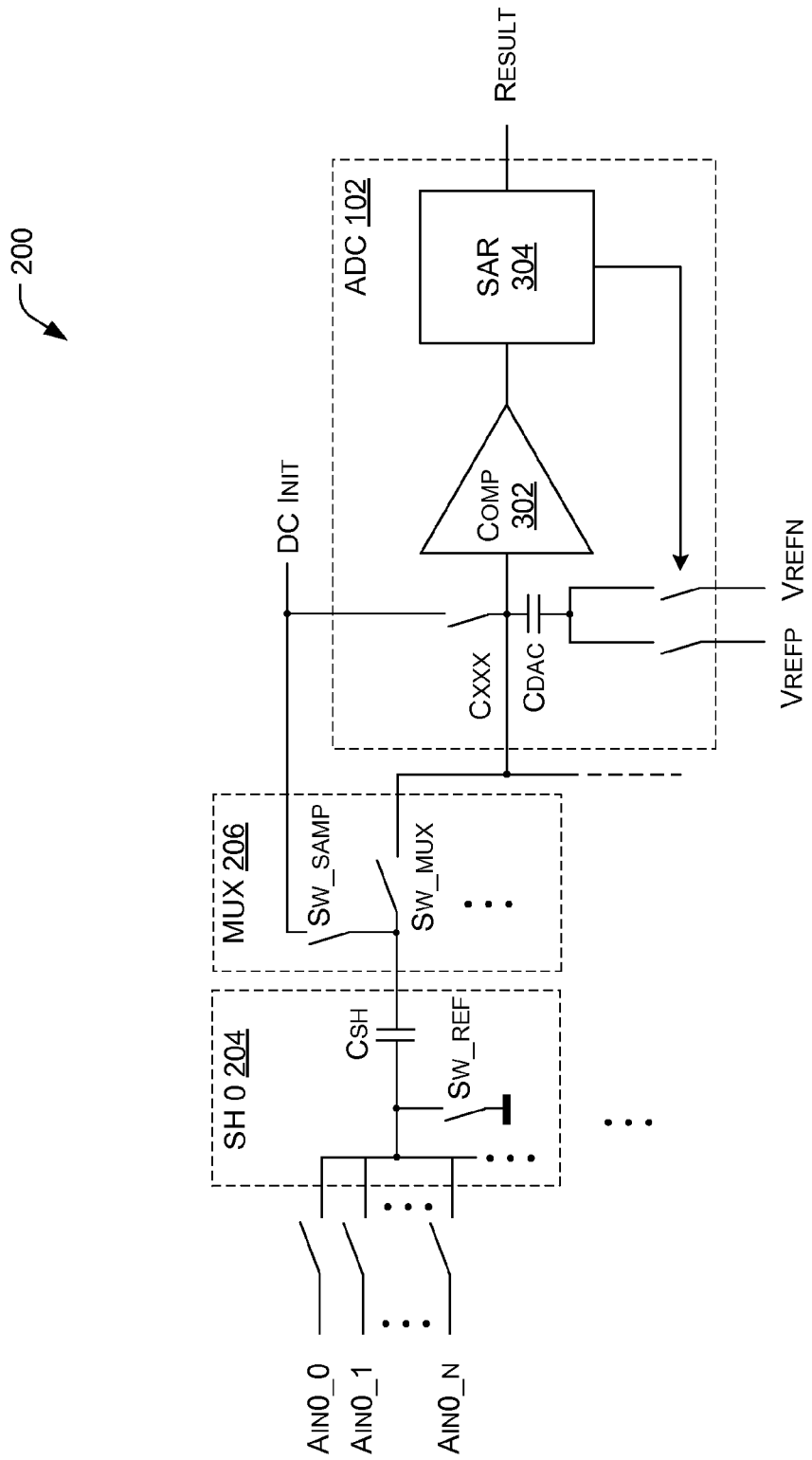
FIG. 3 is a schematic diagram of an example serial analog-to-digital conversion arrangement, according to an implementation.

In one implementation, as shown in FIG. 3, the SH circuits 204 are passive sample and hold circuits. For example, the SH circuits 204 are composed of passive components, and are devoid of active components (e.g., amplifiers, etc.). In the example shown in FIG. 3, the SH 0 circuit 204 is shown comprising a capacitor Csh and a switch Sw_ref. In other implementations, an SH circuit 204 may comprise additional or alternate passive components. In an alternate implementation, a SH circuit 204 may contain one or more active components.

As shown in the schematic of FIG. 3, an analog input signal, such as Ain0_0, is sampled to the capacitor Csh of a SH circuit 204 by closing an input switch to the input (at Ain0_0, for example) and closing the sampling switch Sw_samp on the opposite side of the capacitor Csh. The end of the sample duration is determined by opening the sampling switch Sw_samp, for example. After sampling Ain0_0, the input switch (e.g., at Ain0_0) is opened.

In this example, the capacitor Csh is now charged to the value of Ain0_0-DC Init. This is the "sample value" that is output from the SH circuit 204 to the MUX 206 and to the ADC 102. In the example, DC Init is an internal initialization voltage, independent from the conversion process and the analog inputs (Ain0_0 through AinN_N). The value of DC Init cancels out of the process during the conversion of the analog input (e.g., Ain0_0).

In one implementation, a voltage divider (not shown) may be employed at the SH circuit 204 to allow the ADC 102 to operate at a different voltage level than the voltage level of the analog input signals. For example, a voltage divider may be arranged to divide each of the plurality of analog input signals by a preselected value to scale the analog input signals. In such an implementation, the sample value output from the SH circuit 204 is the result of the voltage divider. In one implementation, the capacitor Csh may be combined with other components (e.g., capacitors, resistors, etc.) to form the voltage divider. More specifically, in various implementations, the capacitors Csh and Cdac (Cdac is described in the following) may be chosen (sized) to achieve a desired scaling of the analog input signals. Furthermore, in various implementations, a resistive divider may be used as a voltage divider preceding the ADC 102 or directly associated with the input of the ADC 102. In one implementation, such a resistive divider may precede the SH circuit 204, be a feature of in the SH circuit 204, precede the MUX 206, or be a feature of in the MUX 206.

In an implementation, as shown in FIGS. 2 and 3, the MUX circuit 206 is arranged to receive a plurality of outputs from the plurality of SH circuits 204 and sequentially make the outputs available for conversion by the ADC 102. For example, the MUX circuit 206 may be arranged to receive a quantity of sample values, including the sample value of each of the plurality of SH circuits 204, and to sequentially output each sample value of the quantity of sample values to the ADC 102.

In one implementation, as shown in FIG. 3, the MUX circuit 206 includes the sampling switch Sw_samp and a multiplexer switch Sw_mux. In alternate implementations, the sampling switch Sw_samp may be located in the SH circuit 204, between the SH circuit 204 and the MUX circuit 206, or the like.

As shown in FIG. 3, the MUX circuit 206 couples a SH circuit 204 (and the corresponding sampled value) to the ADC 102 via the multiplexing switch Sw_mux. In various implementations, there is a multiplexing switch Sw_mux associated with each SH circuit 204 in the serial ADC arrangement 200. The MUX circuit 206 allows several SH circuits 204 to be coupled to the ADC 102, for sequential digital conversion of the outputs of the SH circuits 204. Further, the same sample duration may be had for each of the SH circuits 204 by controlling the sample duration via the sample switch Sw_samp (i.e., closing the switch Sw_samp for a duration while multiple SH circuits 204 are coupled to input analog signals and opening it to conclude the sampling time for each of the coupled SH circuits 204).

When, for example, SH 0 is to be coupled to the ADC 102, and the sample value at the output of SH 0 is to be converted by the ADC 102, the multiplexing switch Sw_mux associated with SH 0 is closed. In an implementation, closing Sw_mux couples the capacitor Csh to the high-impedance node Cxxx of the ADC 102.

In one implementation, to initialize conversion of the sampled value, the input side of Csh is coupled to the reference ground potential of the input (e.g., Ain0_0) by closing switch Sw_ref. This action causes a voltage shift at node Cxxx. In an example, the voltage shift initiates a digital conversion process within the ADC 102.

In an implementation, the interface 202 includes the components of the SH circuits 204 and the MUX circuit 206. In other implementations, the components discussed with reference to the SH circuits 204 and the MUX 206, or the like, may be distributed or integrated differently. In an implementation, the components of the interface 202 are passive components.

In an implementation, as shown in FIGS. 2 and 3, the ADC 102 is arranged to serially convert each sample value received to a respective digital result. In other words, the ADC 102 is arranged to sequentially convert the multiple parallel analog inputs to digital form. In an implementation, the ADC 102 output is a sequence of digital results corresponding to the sequence of the multiplexed inputs (i.e., sample values output from the SH circuits 204).

In one implementation, the ADC 102 comprises a successive approximation ADC (SA-ADC). In another implementation, as shown in FIG. 3, the ADC 102 comprises a switched-capacitor type SA-ADC. For example, the ADC 102 comprises a digital-to-analog conversion (DAC) circuit comprising a switched capacitor Cdac, a comparator 302, and a successive approximation register (SAR) 304.

As described previously, to initialize conversion of the sampled value by the ADC 102, the input side of Csh is coupled to the reference ground potential of the input (e.g., Ain0_0) by closing switch Sw_ref. This action causes a voltage shift at node Cxxx, which is the high-impedance input node of the ADC 102 and the comparator 302. The voltage shift is compensated by a search algorithm involving the comparator 302 and the SAR 304. The capacitor Cdac enables the search described as follows. In an implementation, as shown in FIG. 3, the value DC Init may be added to the input of the comparator 302, cancelling out the addition of the value DC Init to the sample value charged to capacitor Csh, as described prior.

In an implementation, the ADC 102 uses a successive approximation (SA) algorithm to convert sample values to digital results via a binary search. The binary search is conducted through some or all possible quantization levels, and eventually converges on a digital result for the conversion. For example, referring to FIG. 3, the SAR 304 is initialized so that the most significant bit (MSB) is equal to a digital 1. This digital code is output to the DAC circuit (e.g., the switched capacitor Cdac and multiple parallel switches enabling Vrefp and Vrefn), which approximates the digital code to an analog value. In one example, the analog value at this point is approximately equal to one of Vrefp or Vrefn divided by 2.

The analog approximation from the DAC circuit is received by the comparator 302 to be compared with the sample value. If the analog approximation is greater than the sample value, the comparator 302 causes the SAR 304 to reset the MSB to zero, otherwise the bit remains as a 1.

The next bit (e.g., next most significant bit) in the SAR 304 is set to 1, and the same test is performed, with the DAC circuit feeding an analog approximation of the new resulting code to the comparator 302. If the analog approximation is greater than the sample value, the comparator 302 causes the SAR 304 to reset this bit to zero, otherwise the bit remains as a 1. This binary search is continued until every bit in the SAR 302 has been used. In an implementation, the resulting code in the SAR 302 is the digital result (i.e., digital conversion of the sample value). This digital result is output by the ADC 102 via the SAR 304.

Resolution of the ADC 102 may be defined based on the minimum voltage level required to cause a change in the output code (e.g., a reset of a bit from 1 to 0 in the SAR 304). For example, the minimum voltage that causes a change in the digital code is the least significant bit (LSB) of the ADC 102. The resolution of the ADC 102 is the LSB voltage. In alternate implementations, other algorithms are used, or variations of the algorithm described are used, to determine the digital result.

In one implementation, the core components of the ADC 102 operate in a low voltage domain. For example, the comparator 302 and the SAR 304 may be arranged to operate at 5 volts, 3 volts, 1.5 volts, or the like. Operation of the core components of the ADC 102 at lower voltages may be combined with dividing the voltage of the input analog signals, as discussed above, in some implementations. Operation of the core components at lower voltages and/or voltage division of the input analog signals may contribute to power savings by the serial ADC arrangement 200.

In one implementation, as shown in FIG. 2, a demultiplexer (DE-MUX) 208 is included in the serial ADC arrangement 200. In an implementation, the DE-MUX 208 is arranged to direct each digital result output from the ADC 102 to at least one parallel channel. For example, as described above, the DE-MUX 208 de-multiplexes the serial output from the ADC 102, and restores the digital outputs to respective multiple channels. In other words, a digital output that is a result of an analog input from one of the SH circuits 204 is directed to an output channel associated with that SH circuit 204 (e.g., Result 0 is directed to the same channel as SH 0). Accordingly, with a DE-MUX 208, the serial ADC arrangement 200 receives multiple parallel inputs and outputs multiple parallel results.

In various implementations, additional or alternative components may be used to accomplish the disclosed techniques and arrangements.

Representative Process

Figure 4:
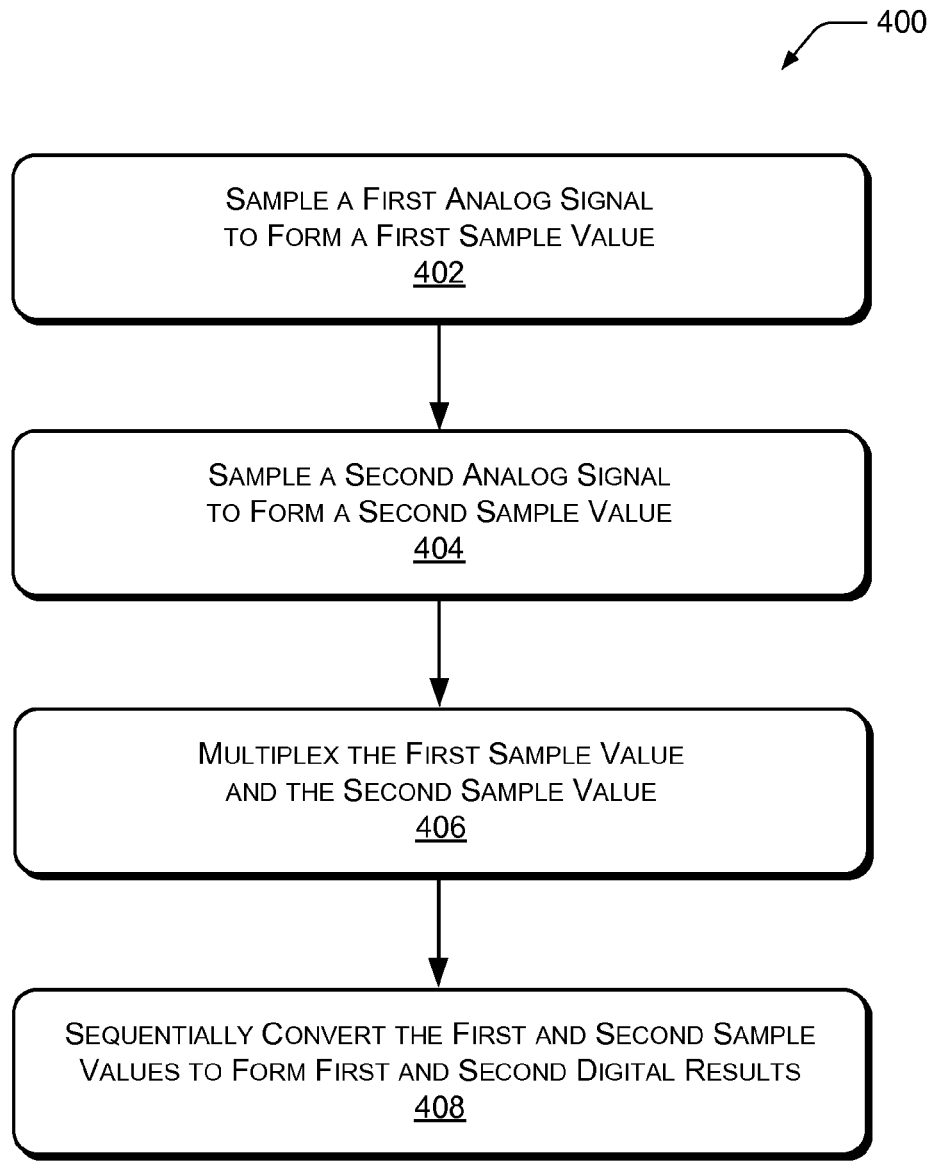
FIG. 4 is a flow diagram illustrating an example process for providing analog to digital conversion of multiple parallel analog inputs, according to an implementation.

FIG. 4 is a flow diagram illustrating an example process 400 for providing analog to digital conversion of multiple parallel analog inputs, according to an implementation. The process 400 describes coupling an input interface to a single analog-to-digital converter (ADC) (such as ADC 102). For example, the interface may comprise a plurality of parallel sample and hold (SH) circuits (such as SH circuits 204). The ADC is arranged to serially convert sample values output from the interface (e.g., the plurality of parallel SH circuits) to digital results. In one example, a plurality of parallel SH circuits are coupled to the ADC via a multiplexer circuit (such as MUX circuit 206) arranged to organize the sample values into a serial form. The process 400 is described with reference to FIGS. 1-3.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 402, the process includes sampling a first analog signal at a first sample and hold (SH) circuit to form a first sample value. At block 404, the process includes sampling a second analog signal at a second SH circuit to form a second sample value. In various implementations, the first and second analog signals are parallel input signals. In one implementation, the process includes sampling the first and second analog signals concurrently.

In an implementation, the first and second analog signals are sampled using passive components and/or circuits. For example, the first and second analog signals may be sampled via a capacitor (such as capacitor Csh). One or more switches may be used to initiate sampling and to determine the sampling duration.

In an implementation, the process includes dividing a value of the first analog signal and/or the second analog signal by a preselected value to scale the first analog signal and/or the second analog signal. For example, the value of the first and/or second analog signals may be a voltage level. In an implementation, the first analog signal and/or the second analog signal may be scaled via one or more capacitive, resistive, or combination voltage dividers (e.g., voltage dividers having capacitive and resistive elements).

At block 406, the process includes multiplexing the first sample value and the second sample value. For example, the first and second sample values may be organized into a serial form. In one implementation, the first and second sample values are multiplexed via multiplexer switches. In one example, each SH circuit has an associated multiplexer switch that is arranged to couple the SH circuit to the ADC and to couple the sample values to the input of the ADC. In an alternate implementation, one or more multiplexer switches may be shared among multiple SH circuits.

At block 408, the process includes sequentially converting the first sample value to form a first digital result and the second sample value to form a second digital result via an analog-to-digital converter (ADC). In one implementation, the first sample value is converted to form a first digital result and the second sample value is converted to form a second digital result using a successive approximation algorithm. In alternate implementations, other types of algorithms are used to convert the first and second sample values and/or other types of ADCs may be employed.

In an implementation, the first and second analog signals are among multiple analog signals received by multiple SH circuits. For example, in one implementation, the process includes sampling a third analog signal at a third sample and hold (SH) circuit to form a third sample value; multiplexing the third sample value with the first sample value and the second sample value; and serially converting the third sample value to form a third digital result via the ADC, in sequence with the first sample value and the second sample value.

In another implementation, the process includes receiving a plurality of analog inputs at the first SH circuit and/or the second SH circuit, sampling the plurality of analog inputs to form a plurality of sample values, multiplexing the plurality of sample values, and sequentially converting the plurality of sample values to form digital results via the ADC.

In one implementation, the process includes de-multiplexing the first digital result to a first output channel and the second digital result to a second output channel. In a further implementation, each SH circuit is associated with a channel, and each output of the ADC is directed (e.g., de-multiplexed) to a channel associated with the respective SH circuit that provided the sample value corresponding to the output. In one implementation, a multiplexer is coupled to the output of the ADC in a reverse configuration to de-multiplex the outputs of the ADC.

In various implementations, the process includes storing the first digital result and/or the second digital result (and/or the third digital result, successive digital results, etc.) in one or more storage registers. In one implementation, each channel may be associated with a separate storage register. For example, the digital results may be de-multiplexed from the output of the ADC into storage registers corresponding to their associated channels.

In alternate implementations, other techniques may be included in the process 400 in various combinations, and remain within the scope of the disclosure.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A device, comprising:
a plurality of sample and hold (SH) circuits, at least one of the plurality of SH circuits arranged to receive a plurality of analog signals;
a multiplexer circuit arranged to receive a plurality of outputs of the plurality of SH circuits and sequentially make the outputs available for conversion, the multiplexer to provide a serially formed signal that comprises at least one signal output from each of the plurality of SH circuits, the multiplexer to receive an initialization voltage;
an analog-to-digital converter (ADC) arranged to serially convert the outputs to respective digital results, the ADC to receive the initialization voltage to cancel the initialization voltage received by the multiplexer; and
a demultiplexer to receive the digital results and to provide digital output signals to multiple channels coupled to the demultiplexer.

2. The device of claim 1, wherein the plurality of SH circuits comprise passive SH circuits.

3. The device of claim 1, wherein the digital results comprise at least one of binary signals or voltage values.

4. The device of claim 1, wherein the digital results are comprised as a serial output signal from the ADC.

5. The device of claim 1, wherein each one of the digital results is provided to a unique one of the multiple channels.

6. A system, comprising:
a plurality of sample and hold (SH) circuits, each of the plurality of SH circuits arranged to receive a plurality of analog signals and to output a sample value based on at least one of the plurality of analog signals;
a multiplexer circuit arranged to receive a quantity of sample values including the sample value of each of the plurality of SH circuits and to sequentially output each sample value of the quantity of sample values as part of a serial signal that comprises a plurality of sample values, at least one of the plurality of sample values associated with the serial signal corresponding to each of the plurality of SH circuits, the multiplexer to receive an initialization voltage;
an analog-to-digital converter (ADC) arranged to serially convert each sample value to a respective digital result, the ADC to receive the initialization voltage to cancel the initialization voltage received by the multiplexer; and
a demultiplexer arranged to direct each digital result to at least one of multiple outputs.

7. The system of claim 6, further comprising a plurality of channels, each channel including at least one SH circuit and at least one associated output.

8. The system of claim 6, further comprising a voltage divider arranged to divide each of the plurality of analog signals by a preselected value to scale the plurality of analog signals.

9. The system of claim 6, further comprising a multiplexer switch associated with each of the plurality of SH circuits and arranged to couple each of the plurality of SH circuits to the ADC.

10. The system of claim 6, further comprising at least one sample switch coupled to each SH circuit of the plurality of SH circuits and arranged to determine a sample duration for the plurality of SH circuits.

11. The system of claim 6, wherein the ADC comprises a successive approximation ADC (SA-ADC).

12. The system of claim 11, wherein the SA-ADC comprises a switched capacitor type SA-ADC.

13. The system of claim 11, wherein the SA-ADC comprises a digital-to-analog conversion (DAC) circuit, a comparator, and a successive approximation register.

* * * * *